United States Patent
McColloch et al.

(10) Patent No.: US 7,061,025 B2
(45) Date of Patent: Jun. 13, 2006

(54) OPTOELECTRONIC DEVICE PACKAGING ASSEMBLIES AND METHODS OF MAKING THE SAME

(76) Inventors: Lawrence R. McColloch, 3798 Inglewood Dr., Santa Clara, CA (US) 95054; James A. Matthews, 878 Alcosta Dr., Milpitas, CA (US) 95035; Robert E Wilson, 2585 Louis Rd., Palo Alto, CA (US) 94304; Brenton A. Baugh, 1504 Madrono Ave., Palo Alto, CA (US) 94306

(*) Notice: Subject to any disclaimer, the term of this patent is extended or adjusted under 35 U.S.C. 154(b) by 252 days.

(21) Appl. No.: 10/386,185

(22) Filed: Mar. 10, 2003

(65) Prior Publication Data
US 2004/0179793 A1  Sep. 16, 2004

(51) Int. Cl.
*H01L 29/22* (2006.01)
*H01L 29/24* (2006.01)
*H07L 21/00* (2006.01)
*G02B 6/36* (2006.01)

(52) U.S. Cl. .......... 257/99; 257/100; 438/25; 438/26; 438/27; 385/92

(58) Field of Classification Search ........... 385/92; 257/99–100; 438/25–27, 106; 372/31; 398/117
See application file for complete search history.

(56) References Cited

U.S. PATENT DOCUMENTS

| | | | |
|---|---|---|---|
| 4,953,006 A | 8/1990 | Kovats | |
| 5,747,363 A * | 5/1998 | Wei et al. | 438/5 |
| 5,771,254 A * | 6/1998 | Baldwin et al. | 372/31 |
| 5,937,124 A | 8/1999 | Roff | |
| 6,097,528 A | 8/2000 | Lebby et al. | |
| 6,555,052 B1 * | 4/2003 | Soga et al. | 420/560 |
| 6,838,689 B1 * | 1/2005 | Deng et al. | 250/559.3 |
| 6,864,423 B1 * | 3/2005 | Tan et al. | 174/52.2 |
| 6,870,267 B1 * | 3/2005 | Zohni | 257/773 |
| 6,870,667 B1 * | 3/2005 | Nakazawa et al. | 359/341.31 |
| 2001/0012767 A1 | 8/2001 | Kim | |
| 2001/0024551 A1 | 9/2001 | Yonemura et al. | |
| 2002/0090013 A1 | 7/2002 | Murry et al. | |
| 2002/0109211 A1 * | 8/2002 | Shinohara | 257/666 |
| 2004/0091268 A1 * | 5/2004 | Hogan et al. | 398/117 |
| 2004/0113262 A1 * | 6/2004 | Elliott et al. | 257/706 |

FOREIGN PATENT DOCUMENTS

| | | |
|---|---|---|
| EP | 0786836 | 1/1997 |
| EP | 0786837 | 1/1997 |
| EP | 0786838 | 1/1997 |
| JP | 04018770 | 1/1992 |
| JP | 4018770 A | 1/1992 |

* cited by examiner

*Primary Examiner*—Frank G. Font
*Assistant Examiner*—Michael P. Mooney

(57) ABSTRACT

Optoelectronic device packaging assemblies and methods of making the same are described. In one aspect, an optoelectronic device packaging assembly includes an electrical sub-mount that includes a mounting area, a device turning mount, and a light-emitting device. The device turning mount has a sub-mount mounting side that is attached to the mounting area of the electrical sub-mount and a device mounting side that has a device mounting area that is oriented in a plane that is substantially perpendicular to the mounting area of the electrical sub-mount. The light-emitting device includes one or more semiconductor layers that terminate at a common light-emitting surface and are operable to emit light from the light-emitting surface. The light-emitting device is attached to the device mounting area of the device turning mount with the light-emitting surface oriented in a plane that is substantially parallel to the mounting area of the electrical sub-mount.

26 Claims, 5 Drawing Sheets

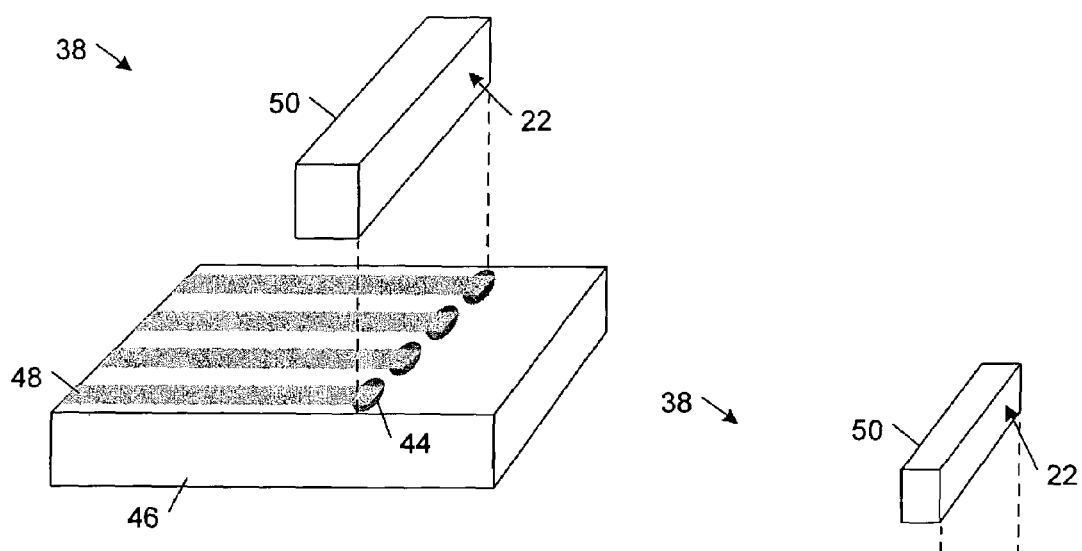
FIG. 3A
FIG. 3B
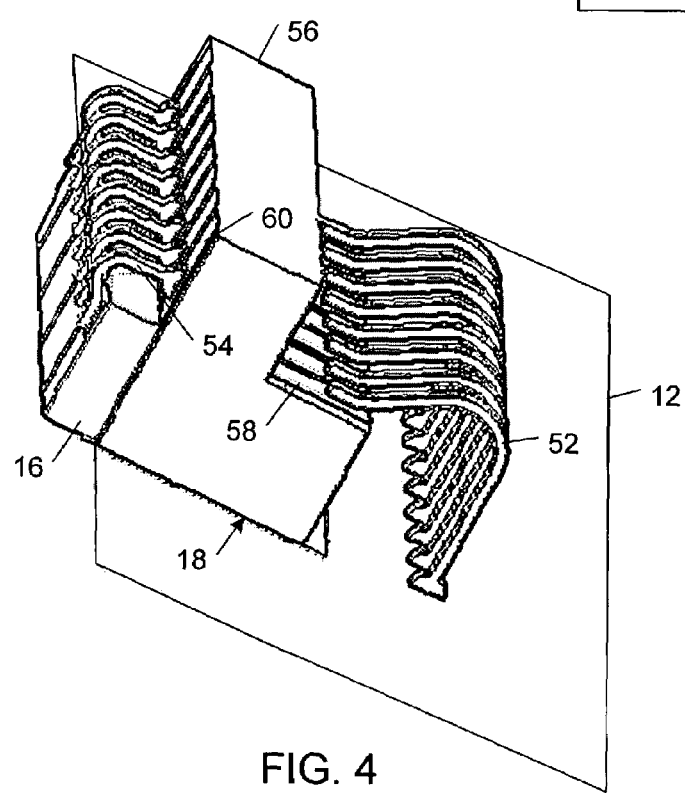
FIG. 4

US 7,061,025 B2

OPTOELECTRONIC DEVICE PACKAGING ASSEMBLIES AND METHODS OF MAKING THE SAME

TECHNICAL FIELD

This invention relates to optoelectronic device packaging assemblies and methods of making the same.

BACKGROUND

Semiconductor lasers and Light Emitting Diodes (LEDs) commonly are used to generate optical signals for optical communications systems. These optical signals are transmitted through optical fibers that act as waveguides to transport the signals to their destination. The semiconductor lasers or LEDs typically are packaged in a windowed or lensed Transistor Outline (TO) package (or can). This TO package provides the environmental protection needed by the semiconductor light-emitting devices. Subsequently, this first-level package (the TO can with the device) is aligned to an optical element and a fiber to complete the assembly that will become part of the optical communication system. The aligned subsystem, including a first level package, an optical element, and some provision for an alignment of the fiber, commonly is referred to as an Optical SubAssembly (OSA).

There are two topologically distinct types of light emitting devices. Light emitting devices of the first type include devices that emit the light from a top surface, such as Vertical Cavity Surface Emitting Lasers (VCSELs) and most LEDs. Light emitting devices of the second type emit light from a side surface; this group includes Fabry-Perot lasers (FP), Distributed Feedback (DFB) lasers and Distributed Bragg Reflector (DBR) lasers. The devices that emit light from the top surface commonly are referred to as surface emitting devices and the devices that emit from the side surface commonly are referred to as edge emitting devices.

Optical communication systems require higher densities of fibers and devices in order to transmit more data. Typically, the need for increased density is satisfied by providing Parallel Optics Modules that contain an array of semiconductor lasers that transmits light through an array of lenses and into an array of optical fibers.

SUMMARY

The invention features optoelectronic device packaging assemblies and methods of making the same. The invention enables edge-emitting optoelectronic devices to be incorporated in vertically-oriented (relative to the plane of the supporting substrate) optoelectronic device modules, thereby simplifying optical alignment procedures relative to horizontally-oriented optoelectronic device modules. In this way, the invention allows edge emitting devices to be handled in a topologically similar way as surface emitting devices. In addition, the invention avoids the need for additional optical components that otherwise would be needed to direct light from a horizontally-oriented edge-emitting optoelectronic device in a vertical direction, thereby reducing the number of optical components that must be aligned.

In one aspect of the invention, an optoelectronic device packaging assembly includes an electrical sub-mount that includes a mounting area, a device turning mount, and a light-emitting device. The device turning mount has a sub-mount mounting side that is attached to the mounting area of the electrical sub-mount and a device mounting side that has a device mounting area that is oriented in a plane that is substantially perpendicular to the mounting area of the electrical sub-mount. The light-emitting device includes one or more semiconductor layers that terminate at a common light-emitting surface and are operable to emit light from the light-emitting surface. The light-emitting device is attached to the device mounting area of the device turning mount with the light-emitting surface oriented in a plane that is substantially parallel to the mounting area of the electrical sub-mount.

In another aspect, the invention features a method of making an optoelectronic device packaging assembly. In accordance with this inventive method, an electrical sub-mount that includes a mounting area is provided. A device turning mount is provided. The device turning mount has a sub-mount mounting side and a device mounting side. The substrate mounting side is attached to the mounting area of the electrical sub-mount with the device mounting area oriented in a plane that is substantially perpendicular to the mounting area of the electrical sub-mount. A light-emitting device is provided. The light-emitting device includes one or more semiconductor layers that terminate at a common light-emitting surface and are operable to emit light from the light-emitting surface. The light-emitting device is attached to the device mounting area of the device turning mount with the light-emitting surface oriented in a plane that is substantially parallel to the mounting area of the electrical sub-mount.

In another aspect, the invention features an optoelectronic device packaging assembly that includes an electrical sub-mount, a device turning mount, and an array of edge-emitting lasers. The electrical sub-mount includes a mounting area. The device turning mount has a sub-mount mounting side attached to the mounting area of the electrical sub-mount and a device mounting side that has a device mounting area oriented in a plane substantially perpendicular to the mounting area of the electrical sub-mount. The array of edge-emitting lasers is attached to the device mounting area of the device turning mount with each edge-emitting laser oriented to emit light in a direction substantially perpendicular to the electrical sub-mount. Each edge-emitting laser is electrically connected to the electrical sub-mount by a direct electrical connection between a respective laser bonding pad and a corresponding bonding pad of the electrical sub-mount.

Other features and advantages of the invention will become apparent from the following description, including the drawings and the claims.

DESCRIPTION OF DRAWINGS

FIG. 3A is a diagrammatic exploded view of a device turning mount having multiple electrical traces extending over multiple respective holes filled with electrically conducting filling material.

FIG. 3B is a diagrammatic perspective view of the device turning mount of FIG. 3A after being cut along a plane aligned with the filled holes to expose the electrically conducting filling material.

FIG. 4 is a diagrammatic perspective view of a second embodiment of an optoelectronic device packaging assembly.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
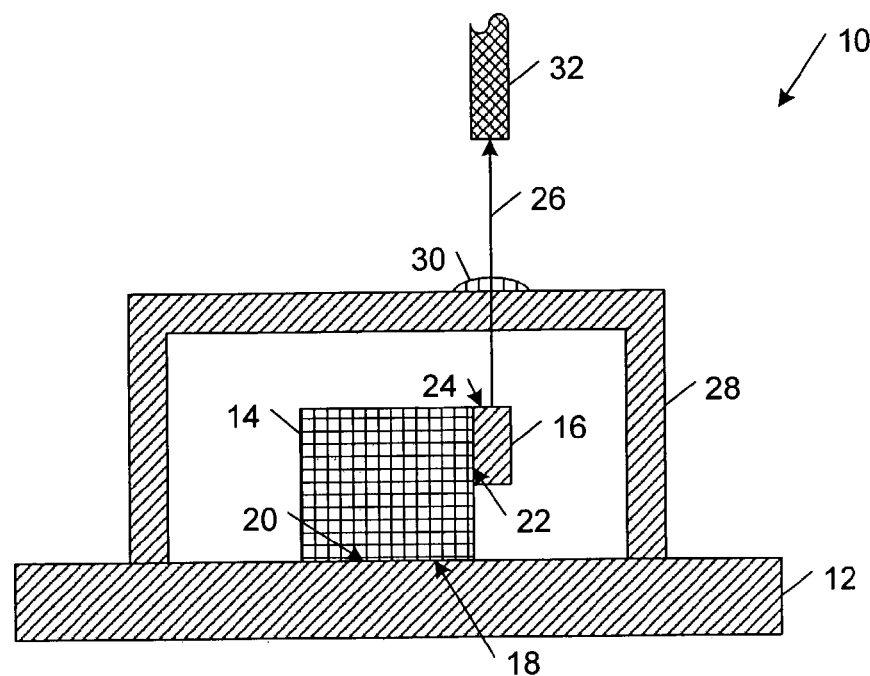
FIG. 1 is diagrammatic cross-sectional side view of an optoelectronic device packaging assembly.

Referring to FIG. 1, in one embodiment, an optoelectronic device packaging assembly 10 includes an electrical sub-mount 12, a device turning mount 14, and a light-emitting device 16. Electrical sub-mount 12 includes a mounting area 18 and device turning mount 14 has a sub-mount mounting side 20 that is attached to the mounting area 18 of the electrical sub-mount 12. Device turning mount 14 also has a device mounting side with a device mounting area 22 that is oriented in a plane that is substantially perpendicular to the mounting area 18 of the electrical sub-mount 12. The light emitting device 16 includes one or more semiconductor layers that terminate at a common light-emitting surface 24 and are operable to emit light 26 from the light-emitting surface 24. The light emitting device 16 is attached to the device mounting area 22 of the device turning mount 14 with the light-emitting surface 24 oriented in a plane that is substantially parallel to the mounting area 18 of the electrical sub-mount 12. In this way, device turning mount 14 enables the light-emitting device 16 to direct light 26 in a direction that is substantially perpendicular to the electrical sub-mount 12.

Electrical sub-mount 12 may be formed of any one of a wide variety of materials that have a high thermal conductivity. In some embodiments, electrical sub-mount 12 is formed of silicon. In some embodiments, electrical sub-mount 12 may be mounted on a printed circuit board or other substrate, which in turn may be mounted within a final device package.

Device turning substrate 14 provides a support for light-emitting device 16 that is rigid, has a high thermal conductivity, and matches the coefficient of thermal expansion (CTE) of the device. Device turning mount 14 may be formed of any one of a wide variety of materials that have a high thermal conductivity. Device turning mount 14 may be electrically insulating or electrically conducting, depending on the way in which the electrical connections between light-emitting device 16 and electrical sub-mount are arranged. In some electrically insulating embodiments, device turning mount 14 may be formed of a ceramic material (e.g., aluminum nitride or beryllium oxide) or diamond. In some electrically conducting embodiments, device turning mount 14 may be formed of a metal (e.g., molybdenum). Device turning mount 14 may be attached to the mounting area 18 of electrical sub-mount 12 using any one of a wide variety of known attachment techniques that are compatible with the materials of the device turning mount 14 and electrical sub-mount 12 and that allow good heat transfer from device turning mount 14 to the electrical sub-mount 12.

Light-emitting device 16 may be any semiconductor edge-emitting device, including a single-mode or multi-mode edge laser and a light emitting diode (LED). Light-emitting device 16 is attached to the device mounting area 22 of device turning mount 14 using one of a wide variety of known attachment techniques that are compatible with the materials of the device turning mount 14 and light-emitting device 16 and that allow good heat transfer from light-emitting device 16 to device turning mount 14. In some embodiments, light-emitting device 16 is die-attached (e.g., eutectic die-attached) to the device mounting area 22 of device turning mount 14.

In the illustrated embodiment, device turning mount 14 and light-emitting device 16 are enclosed by a housing 28 that is attached to electrical sub-mount and supports a lens 30. In one embodiment, housing 28 is formed of silicon. In the illustrated embodiment, light-emitting device 16 may be aligned accurately with lens 30 using conventional alignment techniques. The optoelectronic device packaging assembly 10 may be mounted within a fiber optic connector housing (not shown), which is constructed to align lens 30 with an optical fiber 32.

As shown in FIGS. 2–9, the electrical connections between light-emitting device 16 and electrical sub-mount 12 may be arranged in a number of different ways.

Figure 2:
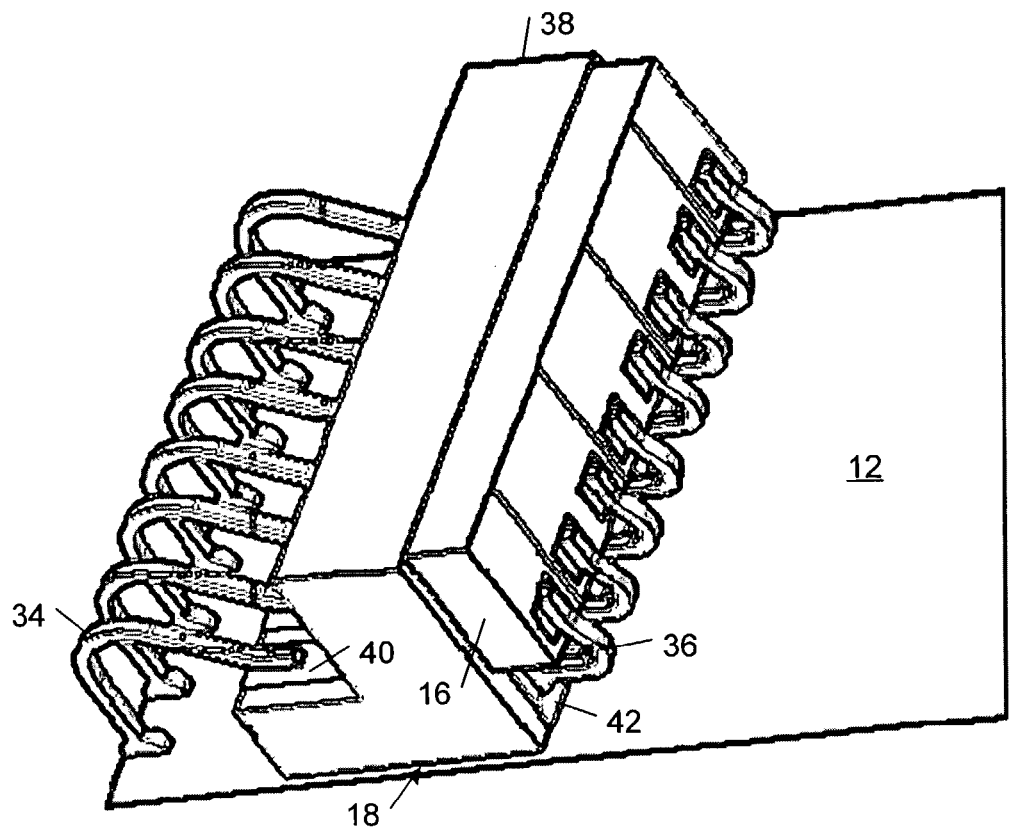
FIG. 2 is a diagrammatic perspective view of an implementation of the optoelectronic device packaging assembly of FIG. 1.

Referring to FIG. 2, in one embodiment, each device of an array of light-emitting devices 16 is connected electrically to electrical sub-mount 12 by a respective pair of wire bonds 34, 36. In this embodiment, a device turning mount 38 is electrically insulating and includes an array of electrical traces each having a respective sub-mount bonding end 40 and a respective device bonding end 42. Sub-mount bonding end 40 is oriented in a plane that is substantially parallel to the mounting area 18 of the electrical sub-mount 12 and device bonding end 42 is oriented in a plane that is substantially perpendicular to the mounting area 18 of the electrical sub-mount 12.

Referring to FIGS. 3A and 3B, in some embodiments, device turning mount 38 may be fabricated as follows. An array of holes 44 (or vias) is formed (e.g., by punching or drilling) in an electrically insulating substrate 46 (e.g., a layer of tape cast aluminum nitride or beryllium oxide). The holes 44 are filled with electrically conducting filling material (e.g., a molybdenum paste). An array of electrically conducting traces 48 is formed on a surface of substrate 46 with each trace 48 extending over a respective hole 44. A second electrically insulating substrate 50 (e.g., a layer of tape cast aluminum nitride or beryllium oxide) is attached to the first substrate 46 to create the mounting area 22 for the light-emitting devices 16. The substrates 46, 50 may be attached using, for example, a conventional sintering process. The electrically conducting filling material in the holes 44 is exposed by cutting substrate 46 in a plane that is orthogonal to the top surface of substrate 46 and aligned with the array of holes 44. The electrical traces 42 corresponding to the electrically conducting filling material in the grooves formed in substrate 46 may be gold-plated.

Referring back to FIG. 2, during fabrication of the optoelectronic device packaging assembly, the light emitting devices 16 are attached to the device turning mount 38.

Next, the device turning mount 38 is attached to the electrical sub-mount 12. The light-emitting devices 16 are oriented to emit an array of light beams away from the electrical sub-mount 12. The light-emitting devices 16 then are wire bonded to device turning mount 38 and the electrical traces of device turning mount 38 are wire bonded to the electrical sub-mount 12.

Referring to FIG. 4, in a second embodiment, each of an array of light-emitting devices 16 is connected electrically to electrical sub-mount 12 by a respective pair of wire bonds 52, 54. The light-emitting devices 16 are oriented to emit an array of light beams toward the electrical sub-mount 12. In this embodiment, a device turning mount 56 is electrically insulating and includes an array of electrical traces each having a sub-mount bonding portion 58 and a device bonding portion 60. Sub-mount bonding portion 58 is oriented in a plane that is substantially parallel to the mounting area 18 of the electrical sub-mount 12 and device bonding portion 60 is oriented in a plane that is substantially perpendicular to the mounting area 18 of the electrical sub-mount 12. The optoelectronic device packaging assembly of FIG. 4 may be fabricated using a process that is similar to the process used to fabricate the optoelectronic device packaging assembly of FIG. 2.

In the above-described embodiments, the bonding pads of light-emitting devices 16 are connected indirectly to corresponding bonding pads of the electrical sub-mount 12 through the electrical traces 40 of the device turning mount. In the embodiments described below, the bonding pads of light-emitting devices 16 are connected directly to corresponding bonding pads of electrical sub-mount 12 by a direct electrical connection. As used herein, the term "direct electrical connection" refers to any electrical connection between a bonding pad of a light-emitting device and a corresponding bonding pad of the electrical sub-mount that does not include an electrical connection through an intermediate bonding pad.

Figure 5:
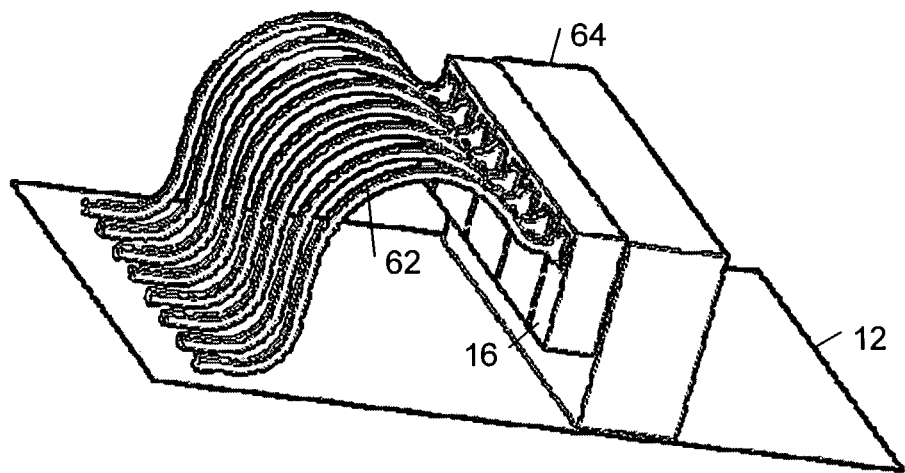
FIG. 5 is a diagrammatic perspective view of a third embodiment of an optoelectronic device packaging assembly.

Referring to FIG. 5, in a third embodiment, each of an array of light-emitting devices 16 is connected electrically to electrical sub-mount 12 by a single respective right angle wire bond 62. Initially, the array of light-emitting devices 16 is attached to a device turning mount 64. The device turning mount 64 is attached to the electrical sub-mount 12. In the illustrated embodiment, the light-emitting devices 16 are oriented to emit light away from the electrical sub-mount 12. The light-emitting devices 16 then are wire bonded to the electrical sub-mount 12. In this embodiment, device turning mount 64 may be electrically insulating or electrically conducting.

Figure 6A:
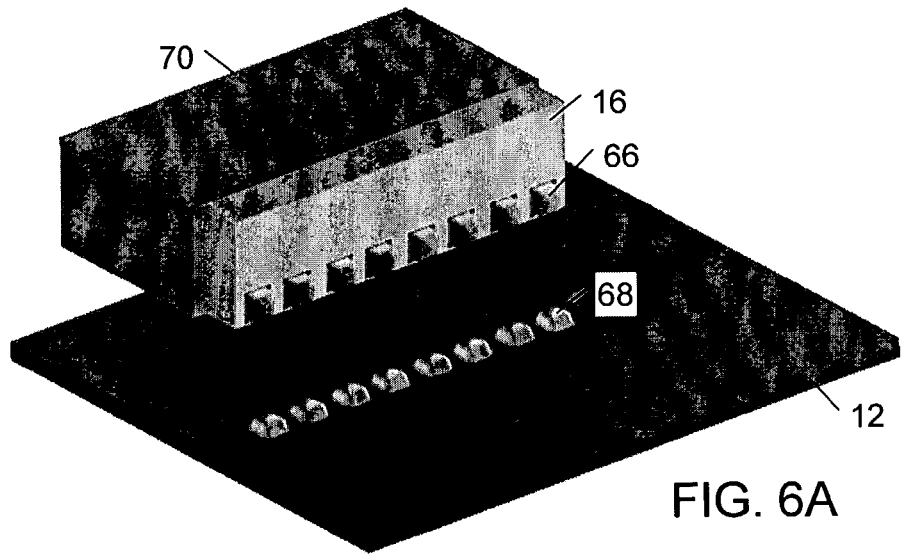
FIGS. 6A and 6B are diagrammatic perspective views at different stages during the fabrication of a fourth embodiment of an optoelectronic device packaging assembly.
Figure 6B:
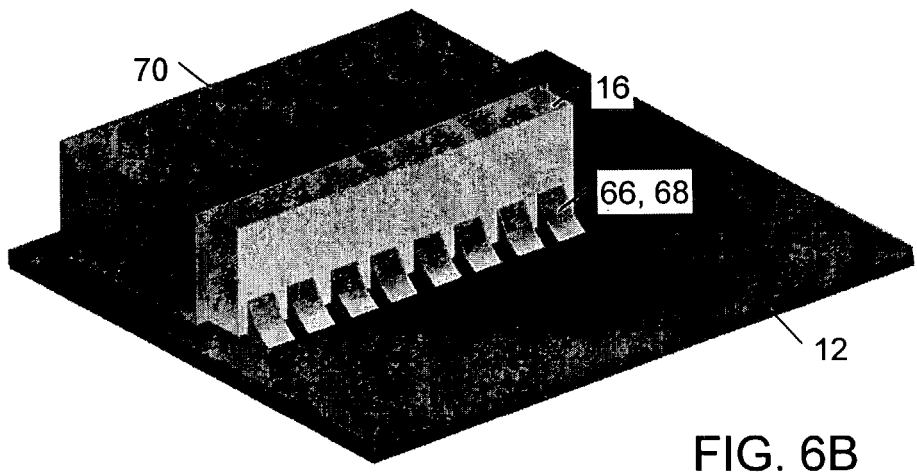

Referring to FIGS. 6A and 6B, in a fourth embodiment, each of an array of light-emitting devices 16 is connected electrically to electrical sub-mount 12 by a respective pair of solder bumps 66, 68. Initially, the array of light-emitting devices 16 is attached to a device turning mount 70. Solder bumps then are attached to the light-emitting devices 16 and to the electrical sub-mount 12 (see FIG. 6A). The device turning mount 70 is attached to the electrical sub-mount 12. Each pair of contacting solder bumps may be bonded together (e.g., by solder reflow) during the same process used to attach device turning mount 70 to electrical sub-mount 12 (see FIG. 6B). In the illustrated embodiment, the light-emitting devices 16 are oriented to emit light away from the electrical sub-mount 12. In this embodiment, device turning mount 70 may be electrically insulating or electrically conducting. In some implementations of this embodiment, each pair of solder bumps 66, 68 may be replaced by a single respective solder bump.

Figure 7:
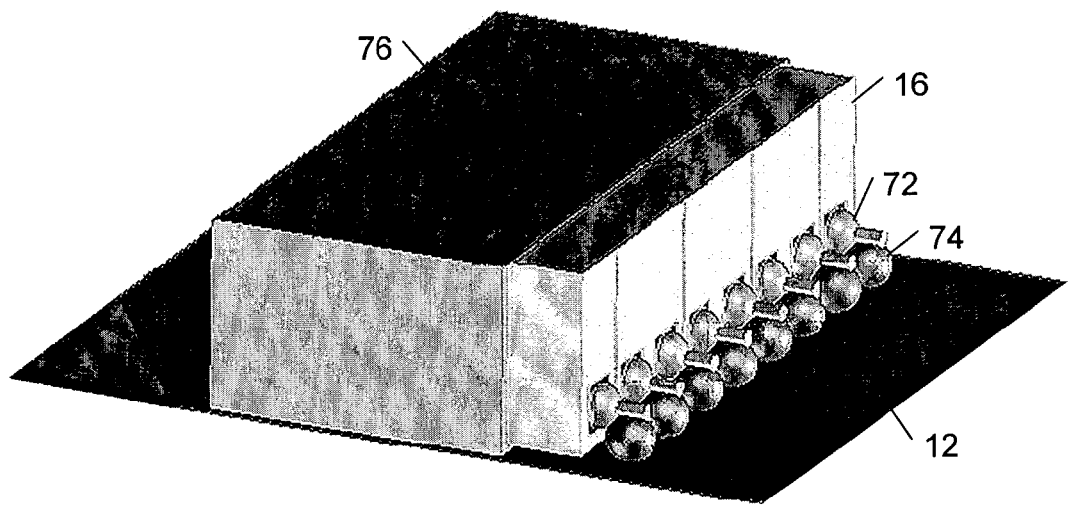
FIG. 7 is a diagrammatic perspective view of a fifth embodiment of an optoelectronic device packaging assembly.

Referring to FIG. 7, in a fifth embodiment, each of an array of light-emitting devices 16 is connected electrically to electrical sub-mount 12 by a respective stud bump 72 and solder ball 74 pair. Initially, the array of light-emitting devices 16 is attached to a device turning mount 76. Stud bumps then are attached to the light-emitting devices 16 and solder balls 74 are attached to the electrical sub-mount 12. The device turning mount 76 is attached to the electrical sub-mount 12. Each stud bump 72 and solder ball 74 pair may be bonded together (e.g., by solder reflow) during the same process used to attach device turning mount 76 to electrical sub-mount 12. In the illustrated embodiment, the light-emitting devices 16 are oriented to emit light away from the electrical sub-mount 12. In this embodiment, device turning mount 76 may be electrically insulating or electrically conducting.

Figure 8A:
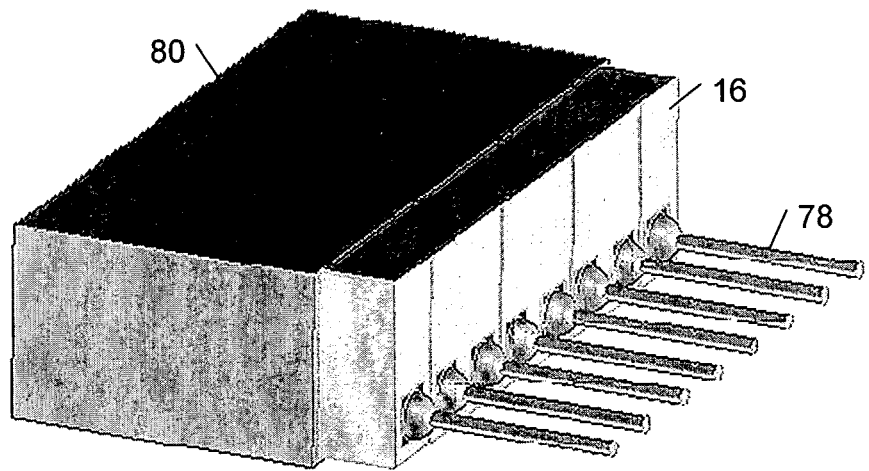
FIGS. 8A and 8B are diagrammatic perspective views of a sixth embodiment of an optoelectronic device packaging assembly.
Figure 8B:
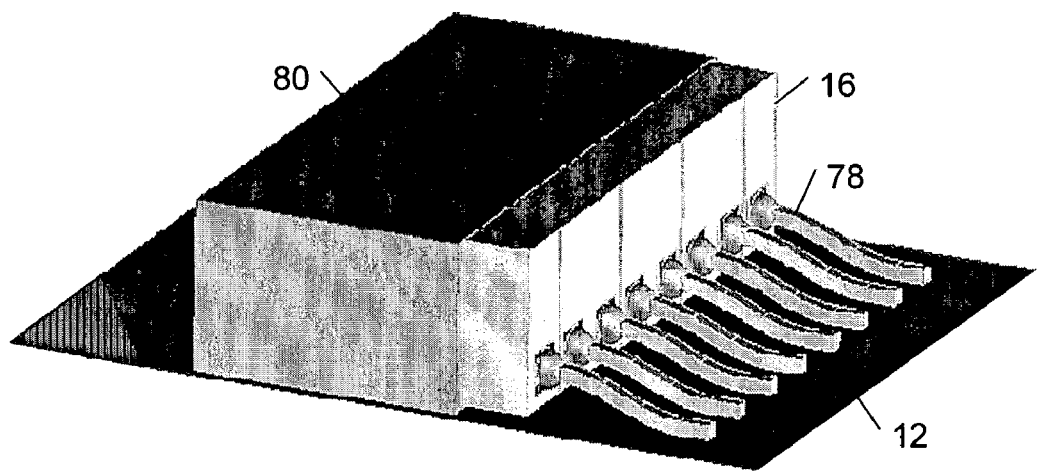

Referring to FIGS. 8A and 8B, in a sixth embodiment, each of an array of light-emitting devices 16 is connected electrically to electrical sub-mount 12 by a respective wire stub 78. Initially, the array of light-emitting devices 16 is attached to a device turning mount 80. Wire stubs then are attached to the light-emitting devices 16 using a stud bump bonding process that has been modified to leave wire stubs extending from the stud bumps (FIG. 8A). The device turning mount 80 is attached to the electrical sub-mount 12. The light-emitting devices 16 then are electrically connected to the electrical sub-mount 12 by wire bonding the ends of the wire stubs 78 to the electrical sub-mount. In the illustrated embodiment, the light-emitting devices 16 are oriented to emit light away from the electrical sub-mount 12 (FIG. 8B). In this embodiment, device turning mount 80 may be electrically insulating or electrically conducting.

Figure 9:
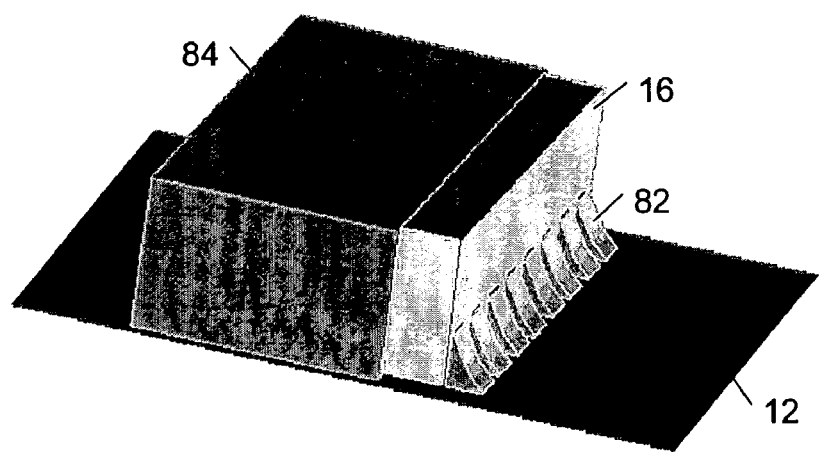
FIG. 9 is a diagrammatic perspective view of a seventh embodiment of an optoelectronic device packaging assembly.

Referring to FIG. 9, in a seventh embodiment, each of an array of light-emitting devices 16 is connected electrically to electrical sub-mount 12 by a respective shot ball connection 82. Initially, the array of light-emitting devices 16 is attached to a device turning mount 84. The device turning mount 84 is attached to the electrical sub-mount 12. Next, balls of electrically conducting material (e.g., gold) are shot toward the connection joints formed between the light-emitting device contacts and the contacts on the electrical sub-mount 12. The balls may be flash heated (e.g., using a laser) as they are being shot at the connection joints or the balls may be reflowed after being shot at the connection joints. The resulting electrically conducting wedges each has substantially orthogonal sides that are connected respectively to the electrical sub-mount 12 and a contact of a respective light-emitting device 16. In the illustrated embodiment, the light-emitting devices 16 are oriented to emit light away from the electrical sub-mount 12. In this embodiment, device turning mount 84 may be electrically insulating or electrically conducting.

Other embodiments are within the scope of the claims. For example, although the above embodiments are described in connection with optoelectronic transmitter devices, these embodiments readily may be incorporated into optoelectronic transceiver modules.

What is claimed is:
1. An optoelectronic device packaging assembly, comprising:
 an electrical sub-mount including a mounting area and a sub-mount bonding pad;
 a device turning mount having a sub-mount mounting side attached to the mounting area of the electrical sub-mount and a device mounting side having a device mounting area oriented in a plane substantially perpendicular to the mounting area of the electrical sub-mount;
a light-emitting device including a device bonding pad and one or more semiconductor layers terminating at a common light-emitting surface and operable to emit light from the light-emitting surface, wherein the light-emitting device is attached to the device mounting area of the device turning mount with the light-emitting surface oriented in a plane substantially parallel to the mounting area of the electrical sub-mount and the device bonding pad adjacent the sub-mount bonding pad; and
a direct electrical connection between the device bonding pad and the sub-mount bonding pad, wherein the electrical connection includes one or more electrically conductive bumps forming a continuous electrical connection from the device bonding pad to the sub-mount bonding pad.

2. The packaging assembly of claim 1, wherein the light-emitting surface of the light-emitting device is oriented to emit light away from the electrical sub-mount.

3. The packaging assembly of claim 1, wherein the light-emitting surface of the light-emitting device is oriented to emit light toward the electrical sub-mount.

4. An optoelectronic device packaging assembly, comprising:
an electrical sub-mount including a mounting area;
a device turning mount having a sub-mount mounting side attached to the mounting area of the electrical sub-mount and a device mounting side having a device mounting area oriented in a plane substantially perpendicular to the mounting area of the electrical sub-mount, wherein the device turning mount includes an electrical trace having a sub-mount bonding portion oriented in a plane substantially parallel to the mounting area of the electrical sub-mount and a device bonding portion oriented in a plane substantially perpendicular to the mounting area of the electrical sub-mount; and
a light-emitting device including one or more semiconductor layers terminating at a common light-emitting surface and operable to emit light from the light-emitting surface, wherein the light-emitting device is attached to the device mounting area of the device turning mount with the light-emitting surface oriented in a plane substantially parallel to the mounting area of the electrical sub-mount.

5. The packaging assembly of claim 4, wherein the electrical trace extends through a volume of the device turning mount.

6. The packaging assembly of claim 4, wherein the device bonding portion of the electrical trace corresponds to electrically conducting material formed in a groove defined in a surface of the device mounting side of the device turning mount.

7. The packaging assembly of claim 4, further comprising a wire bond connected between the electrical sub-mount and the sub-mount bonding portion of the electrical trace and a wire bond connected between the device bonding portion of the electrical trace and the light-emitting device.

8. The packaging assembly of claim 1, wherein one of the electrically conductive bumps is a solder bump directly bonded to the sub-mount bonding pad.

9. The packaging assembly of claim 8, wherein the one or more electrically conductive bumps include a second solder bump directly bonded to the device bonding pad and directly bonded to the first solder bump.

10. The packaging assembly of claim 8, wherein the one or more electrically conductive bumps include a wire stud bump directly bonded to the device bonding pad and directly bonded to the solder bump.

11. The packaging assembly of claim 1, wherein the one or more electrically conductive bumps correspond to a continuous solder mass electrically directly connecting the device bonding pad to the sub-mount bonding pad.

12. The packaging assembly of claim 1, wherein the electrical sub-mount is formed of silicon.

13. The packaging assembly of claim 1, wherein the device turning mount is electrically insulating.

14. The packaging assembly of claim 1, wherein the electrical sub-mount comprises multiple sub-mount bonding pads, and further comprising:
one or more additional light-emitting devices each including a respective device bonding pads and one or more semiconductor layers terminating at a common light-emitting surface and operable to emit light from the light-emitting surface, wherein each light-emitting device is attached to the device mounting area of the device turning mount with a respective light-emitting surface oriented in a plane substantially parallel to the mounting area of the electrical sub-mount and the respective device bonding pad adjacent a corresponding one of the sub-mount bonding pads; and
direct electrical connections between the device bonding pads and respective ones of the corresponding sub-mount bonding pads, wherein each of the electrical connections includes one or more electrically conductive bumps forming a continuous electrical connection from a respective one of the device bonding pads to the corresponding sub-mount bonding pad.

15. The packaging assembly of claim 1, further comprising a housing formed of silicon, attached to the electrical sub-mount, and enclosing the device turning mount and the light-emitting device.

16. The packaging assembly of claim 1, wherein the light-emitting device is an edge-emitting laser.

17. An optoelectronic device packaging assembly, comprising:
an electrical sub-mount including a mounting area;
a device turning mount having a sub-mount mounting side attached to the mounting area of the electrical sub-mount and a device mounting side having a device mounting area oriented in a plane substantially perpendicular to the mounting area of the electrical sub-mount; and
an array of edge-emitting lasers attached to the device mounting area of the device turning mount with each edge-emitting laser oriented to emit light in a direction substantially perpendicular to the electrical sub-mount, each edge-emitting laser being electrically connected to the electrical sub-mount by a direct electrical connection between a respective laser bonding pad and a corresponding bonding pad of the electrical sub-mount.

18. The packaging assembly of claim 17, wherein each electrical connection includes a wire, one end of each wire being wire bonded to a respective laser bonding pad and another end of each wire being wire bonded to a respective electrical sub-mount bonding pad.

19. The packaging assembly of claim 18, wherein one end of each wire is stud bump bonded to a respective laser bonding pad and another end of each wire is wire bonded to a respective electrical sub-mount bonding pad.

20. The packaging assembly of claim 18, wherein each electrical connection includes a solder bump bonded to a respective electrical sub-mount bonding pad.

21. The packaging assembly of claim 20, wherein each electrical connection includes a second solder bump bonded to a respective laser bonding pad and to a solder ball bonded to a respective electrical sub-mount bonding pad.

22. The packaging assembly of claim 20, wherein each electrical connection includes a wire stud bump electrically coupled between a respective laser bonding pad and a solder ball bonded to a respective electrical sub-mount bonding pad.

23. The packaging assembly of claim 18, wherein each electrical connection corresponds to a solder mass electrically connecting a respective laser bonding pad to a respective electrical sub-mount bonding pad.

24. The packaging assembly of claim 1, wherein the electrical sub-mount is formed of silicon.

25. The packaging assembly of claim 4, wherein the device turning mount is electrically insulating.

26. The packaging assembly of claim 25, wherein the device turning mount comprises two electrically insulating substrates.

* * * * *